United States Patent
Lee

(10) Patent No.: US 9,425,008 B1
(45) Date of Patent: Aug. 23, 2016

(54) CONTACTLESS SWITCH WITH SHIELDED VANE

(71) Applicant: Eaton Corporation, Cleveland, OH (US)

(72) Inventor: Davin Robert Lee, Watertown, WI (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 14/927,639

(22) Filed: Oct. 30, 2015

(51) Int. Cl.
*H01H 36/02* (2006.01)
*H01H 23/12* (2006.01)
*H01H 13/14* (2006.01)

(52) U.S. Cl.
CPC ............. *H01H 36/02* (2013.01); *H01H 13/14* (2013.01); *H01H 23/12* (2013.01)

(58) Field of Classification Search
CPC .. H03K 17/97; H01H 23/30; H01H 11/0018; H01H 23/06; H01H 23/025; H01H 23/145; H01H 36/02
See application file for complete search history.

(56) References Cited

U.S. PATENT DOCUMENTS

| | | | |
|---|---|---|---|
| 4,150,348 A | 4/1979 | Foltz | |
| 4,221,941 A | 9/1980 | Genovese | |
| 4,321,442 A | 3/1982 | Tanaka et al. | |
| 4,489,297 A | 12/1984 | Haydon et al. | |
| 4,697,053 A | 9/1987 | Lockard | |
| 4,803,317 A | 2/1989 | Sutoh et al. | |
| 5,053,591 A | 10/1991 | Theurer | |
| 6,124,771 A | 9/2000 | Kim et al. | |
| 6,339,201 B1 | 1/2002 | Balaban et al. | |
| 6,566,619 B2 | 5/2003 | Gillman et al. | |
| 6,576,855 B2 | 6/2003 | Levendis et al. | |
| 6,867,680 B1 | 3/2005 | Kulle | |
| 6,919,523 B1 | 7/2005 | Lai | |
| 7,026,565 B1 | 4/2006 | Lee | |
| 7,105,762 B1 | 9/2006 | Lee | |
| 7,576,293 B2 | 8/2009 | Nagai et al. | |
| 7,679,362 B2 | 3/2010 | Koski | |
| 7,952,044 B2 | 5/2011 | Lee | |
| 8,138,872 B2 | 3/2012 | Yoshihara et al. | |
| 8,570,126 B1 | 10/2013 | Lee et al. | |
| 2010/0289484 A1 | 11/2010 | Quinn | |
| 2011/0114465 A1 | 5/2011 | Gillmann et al. | |

*Primary Examiner* — Mohamad Musleh
(74) *Attorney, Agent, or Firm* — Ziolkowski Patent Solutions Group, SC

(57) ABSTRACT

A switch includes a switch housing, a button, a circuit board having at least one magnet sensor, and a magnet holder, including at least one magnet, movably mounted to the housing to move responsive to an actuation of the button. A vane interrupter in the switch includes a passage structure positioned proximate to each magnet sensor such that a respective magnet is movable at least partially within a passage defined by the passage structure, and a flange structure having a first flange and a second flange positioned on opposing ends of the passage structure, with the first flange positioned adjacent a portion of the magnet holder holding the magnet and with the second flange positioned adjacent a surface of the circuit board opposite a surface on which the at least one magnet sensor is positioned, such that the circuit board is positioned between the magnet holder and the second flange.

20 Claims, 9 Drawing Sheets

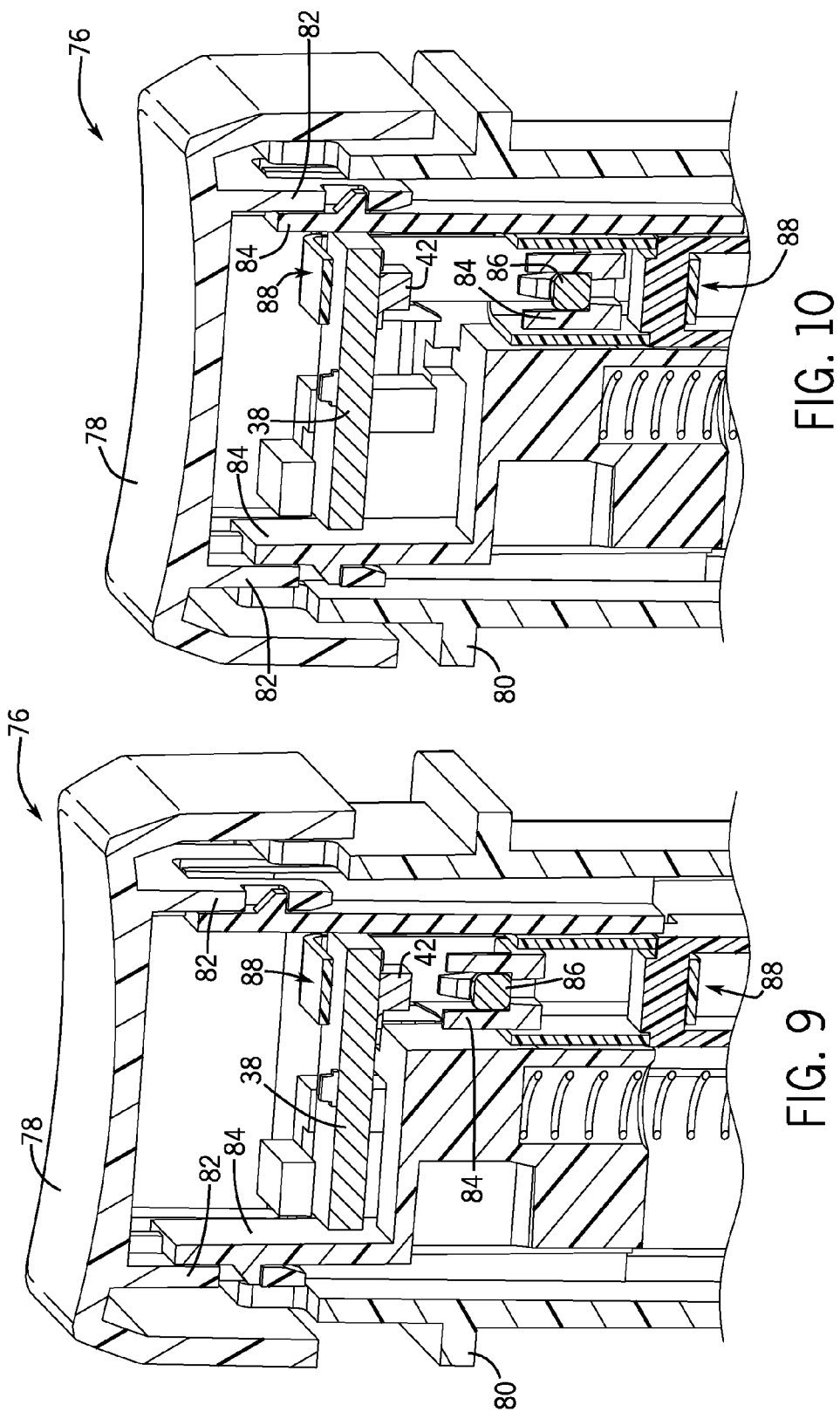

CONTACTLESS SWITCH WITH SHIELDED VANE

BACKGROUND OF THE INVENTION

The present invention relates generally to control switches and, more particularly, to a contactless control switch that includes a shielded vane therein to provide magnetic shielding to a magnetic sensor of the switch.

Electrical switches are used as control switches for a variety of applications in various industries, with one such example being in specialty vehicle markets—such as heavy trucks, agricultural equipment, and construction equipment, for example—where the switches are employed to control the motor vehicle lighting, the windshield wipers, the rear windshield heating, the cruise control functions, the internal central locking and other functions on and off. Often the control switches are in the form of rocker switches that may be pushed by an operator to rotate/tilt from a neutral position (i.e., switched-off state) to one or more activated positions (i.e., a switched-on state) that control operation of an associated system/component, although control switches may also be constructed as pushbutton switches or toggle switches as other examples.

One type of common control switch is a contactless switch that operates by moving a magnet past a fixed magnetic sensor, such as a Hall effect IC or a magnetoresistive sensor, in order to control and determine the functions/modes provided by the switch. With respect to contactless control switches that are utilized for one of various applications, it is recognized that existing designs of such switches can limit the performance thereof. For example, existing contactless control switches constructions may suffer from issues regarding the ability of the magnetic sensors to detect the magnetic field with sufficient strength, such that discerning a distinct switching position may be difficult. This problem of correctly discerning a distinct switching position may be further compounded if the switch is not constructed in a fashion that provides the magnetic sensors with sufficient protection from external magnetic fields, as the presence of such external magnetic fields interferes with the ability of the magnetic sensors to attribute a sensed magnetic field to the switch magnets.

To provide protection from external magnetic fields, some prior art contactless control switches implement a shielding housing that completely surrounds the switch in order to block the external magnetic fields from the magnetic sensors therein. While such shielding housings may be effective in providing magnetic shielding, it is recognized that the housing can be bulky and increase the size of the switch. Such shielding housings can also increase the overall cost of the switch, as they necessitate the addition of an entirely separate/additional component to the switch.

It would therefore be desirable to provide a contactless control switch that is resistant to the influence from external magnetic fields. It would further be desirable for such a contactless control switch to be provided with such external magnetic field shielding without requiring the addition of a dedicated/separate shielding housing.

BRIEF DESCRIPTION OF THE INVENTION

In accordance with one aspect of the invention, a switch includes a switch housing, a button moveably mounted to the housing, a circuit board mounted to the housing and including at least one magnet sensor and a magnet holder, including at least one magnet, movably mounted to the housing so as to move responsive to an actuation of the button by a user, such that the at least one magnet is selectively movable to positions distal to and proximate to the magnet sensor. The switch also includes a vane interrupter having a passage structure positioned proximate to each magnet sensor of the at least one magnet sensor such that a respective magnet of the at least one magnet is movable at least partially within a passage defined by the passage structure and a flange structure positioned adjacent each passage structure, the flange structure comprising a first flange and a second flange positioned on opposing ends of the passage structure, with the first flange positioned adjacent a portion of the magnet holder holding the magnet and with the second flange positioned adjacent a surface of the circuit board opposite a surface on which the at least one magnet sensor is positioned, such that the circuit board is positioned between the magnet holder and the second flange.

In accordance with another aspect of the invention, a switch includes a switch housing, an operating member mounted to the switch housing and movable between a plurality of positions responsive to physical actuation thereof by an operator, one or more magnet sensors secured relative to the housing, and a magnet holder mounted to the housing to position one or more magnets included thereon adjacent the one or more magnet sensors, the magnet holder moving responsive to an actuation of the operating member by a user so as to provide for positioning of the one or more magnets. The switch also includes a vane interrupter configured to provide selective magnetic shielding about the one or more magnets and to the one or more magnet sensors, the vane interrupter comprising a C-shaped frame that includes a lengthwise member oriented generally parallel to a direction of movement of the one or more magnets to form a passage sized to accommodate positioning of a respective magnet of the one or magnets therein and a pair of flanges formed on or attached to opposing ends of the lengthwise member and oriented generally perpendicular thereto. A respective magnet sensor of the one or more magnet sensors and a respective magnet of the one or more magnets are positioned between the pair of flanges of the C-shaped frame, such that the pair of flanges provide shielding to the respective magnet sensor from external magnetic fields.

In accordance with yet another aspect of the invention, a rocker switch includes a switch housing, a rocker button mounted to the switch housing and actuatable between a neutral position, a first position, and a second position, a magnet holder including therein a first magnet and a second magnet and being mounted to the housing so as to be rotatable relative thereto, a first Hall effect sensor and a second Hall effect sensor positioned adjacent the first magnet and the second magnet, respectively, and a vane interrupter comprising a C-shaped frame on each of opposing sides thereof such that a first C-shaped frame is positioned adjacent the first magnet sensor and the first magnet and a second C-shaped frame is positioned adjacent the second magnet sensor and the second magnet. Each of the C-shaped frames further includes a passage structure positioned proximate to a respective magnet sensor such that a respective magnet is movable at least partially within a passage defined by the passage structure and a flange structure positioned adjacent the passage structure and including a first flange and a second flange positioned on opposing ends of the passage structure, with the flange structure positioned to shield its respective Hall effect sensor from external magnetic fields.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings:

FIGS. 9 and 10 are sectional views of the pushbutton switch module of FIG. 8 in a first position and a second position.

DETAILED DESCRIPTION OF THE INVENTION

Embodiments of the present invention provide a contactless control switch that is resistant to the influence from external magnetic fields. The contactless control switch is constructed to have one or more moveable magnets that provide two or three distinct switching positions, with the magnets generating a magnetic field sensed by one or more magnetic sensors in the switch such that a distinct switching position of the control switch may be easily discerned. A shielded vane interrupter incorporated in the switch provides shielding to the one or more magnetic sensors from external magnetic fields, so as to improve the functionality of the contactless control switch and provide for better discernment of the distinct switching positions for the switch.

While contactless control switches are described here below as being employed as vehicle control switches, it is recognized that the switches could be used in applications outside of vehicle control switches. Accordingly, embodiments of the invention are not limited to use as vehicle control switches and it is understood that the scope of the invention extends to contactless control switches for various other applications.

Figure 1:
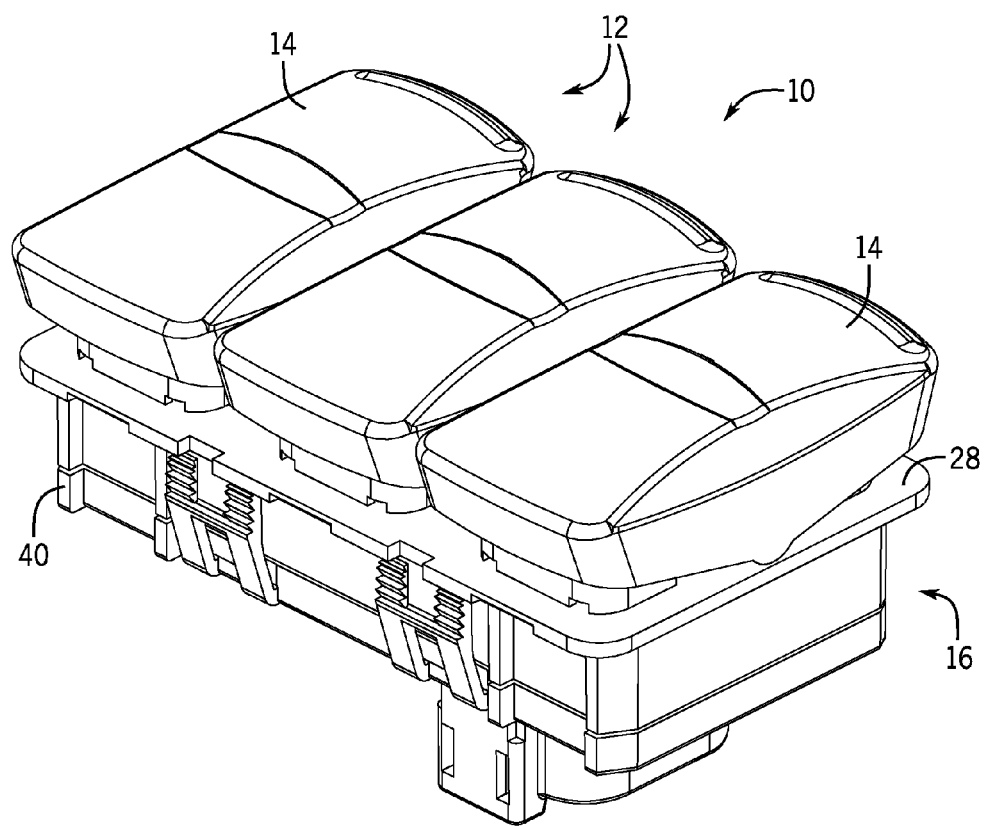
FIG. 1 is a perspective view of a switch module that includes a plurality of rocker-type control switches, according to an embodiment of the invention.

Referring to FIG. 1, a switch module 10 is illustrated according to an embodiment of the present invention. The switch module 10 includes a number of control switches 12 therein. The switch module 10 includes communication ports and a power receptacle (not shown) formed on a back surface thereof to enable powering of the module and communication to/from the module, such as via mating of the module 10 with a communication interface feature that enables the switch modules to communicate with a communication bus, such as a CAN or LIN bus, for example. It is recognized that a greater or smaller number of switches 12 could be included in the switch module 10, and that the arrangement of switches 12 in the module 10 could differ, such as the switches being arranged in a single row or in two rows, for example. Thus, the switch module 10 illustrated in FIG. 1 is meant to be an example only and is not meant to limit the scope of the invention in any regard.

According to one embodiment, the switch module 10 may be incorporated as part of the dashboard in a motor vehicle, such as a heavy truck, goods vehicle, agricultural equipment, or construction equipment, for example. An operator of the vehicle uses the control switches 12 to operate various functions in the vehicle, such as for switching the motor vehicle lighting, the windshield wipers, the diesel fuel heating, or controlling other specialized equipment on the vehicle—such as a power take-off (PTO) or "safety" related vehicle feature.

As shown in FIG. 1, according to an exemplary embodiment, the control switches 12 are constructed as rocker switches that include an operating member 14—in the form of a rocker button—that is moveably mounted to a switch housing 16. The rocker button 14 is actuated/pushed by an operator to control operation of the respective switch, with the rocker button 14 being movable between a neutral/off position and one or two activated positions. That is, if the operator pushes one side of the rocker button 14, the button is moved to a first activated switch position, and if the operator pushes the other side of the rocker button 14, the button is moved to a second activated switch position.

Figure 2:
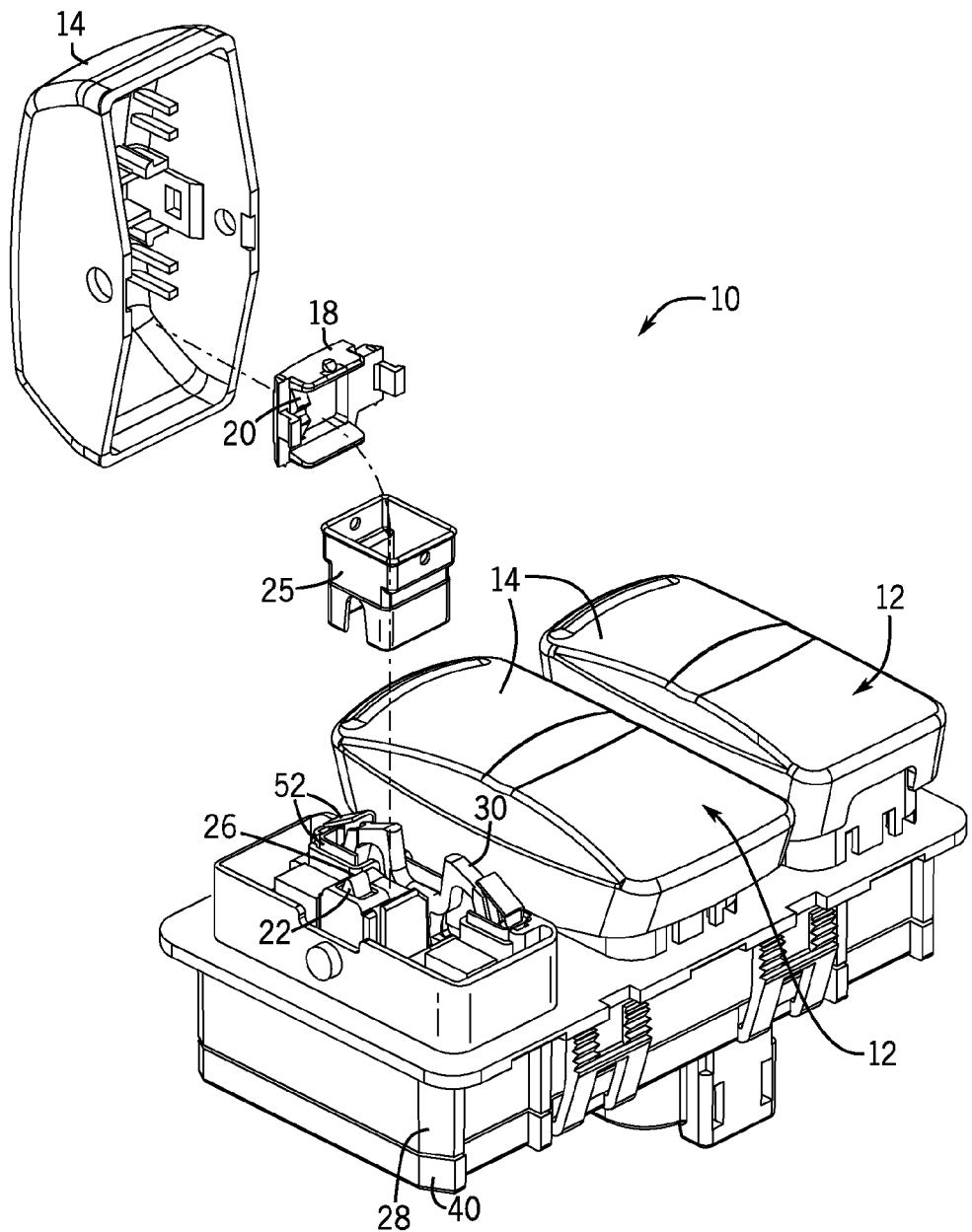
FIG. 2 is a partially exploded view of the switch module of FIG. 1.
Figure 3:
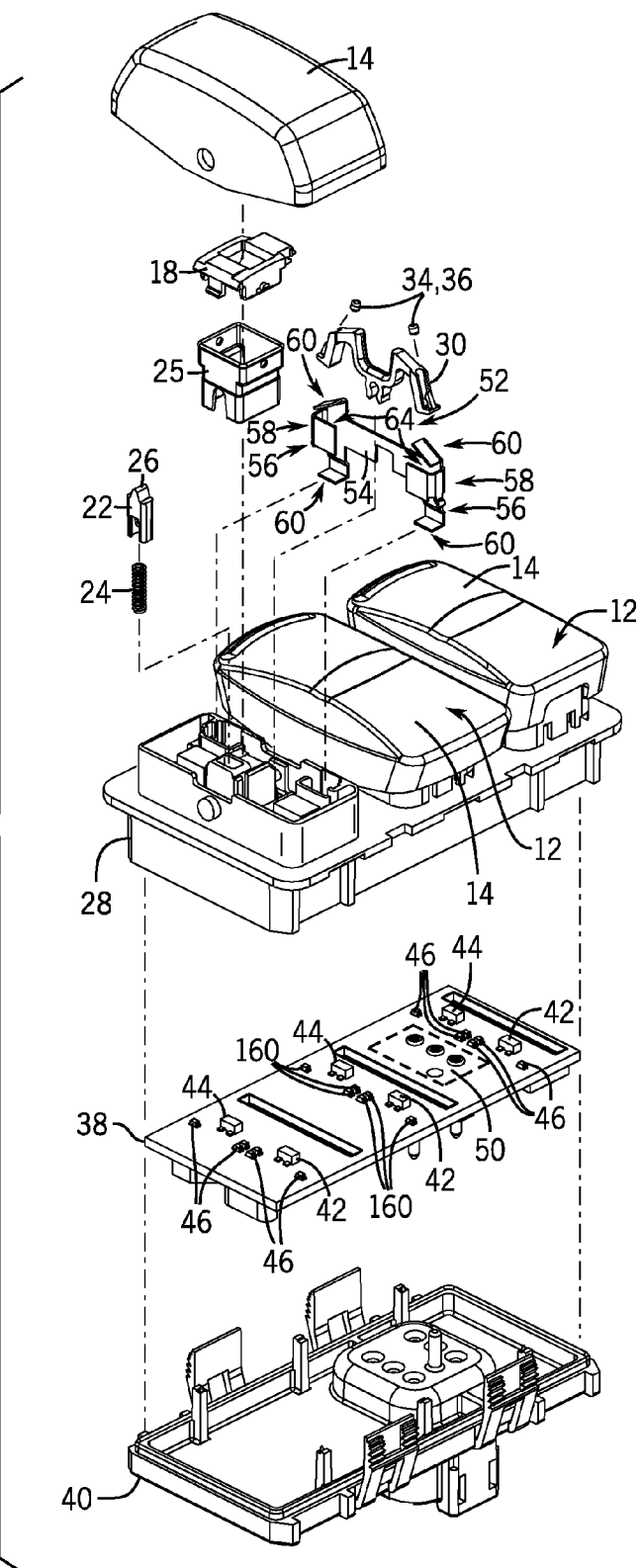
FIG. 3 is an exploded view of the switch module of FIG. 1.

Referring now to FIGS. 2 and 3, partially exploded and fully exploded views of the switch module 10 of FIG. 1 are illustrated. As shown FIGS. 2 and 3, switch 12 includes a switch profile member 18 disposed on an underside of rocker button 14. Switch profile member 18 has a profile contour 20 that is disposed on the underside of button 14 and interacts with a plunger 22 that is biased toward profile contour 20 by a spring 24, with the plunger 22 and spring 24 being surrounded by a seal 25. The contact made by the end 26 of biased plunger 22 against profile contour 20 dictates the tactile response of rocker button 14 felt by the user. The illustrated example shows but one example contour 20, and other contours may be implemented according to embodiments of the invention. Several forms of switching action may be provided by selecting a corresponding profile contour 20. Such switching action can include, for example, momentary, sustained, two position or three position.

As shown in FIG. 3, the switch module 10 also includes a frame 28, magnet holder 30, magnets 34, 36, a printed circuit board ("PCB") assembly 38 and a back cover 40. The PCB assembly 38 includes a pair of electromagnetic sensors 42, 44 thereon—a first sensor 42 and a second sensor 44—that, according to one embodiment, are Hall Effect sensors configured to detect magnets 34, 36, but may instead be magnetoresistive (MR) sensors, for example. Hall Effect sensors 42, 44 act as transducers responsive to the magnetic field of magnets 34, 36, which can be permanent magnets according to one aspect of the present teachings. According to one aspect of the present teachings, back cover 40 and frame 28 together form the switch housing 16, with the PCB assembly 38 being mounted therein. In one embodiment, a top surface of the frame 28 will be generally flush with a system in which the switch module 10 is utilized, such as a vehicle dashboard, for example. In one embodiment, when housing 16 is assembled, PCB assembly 38 is mounted within housing 16, so as to be sealed therein such that it is protected from dirt, water, etc. in the ambient environment, although in other embodiments no seal may be provided about PCB assembly 38. Sensors 42, 44 are mounted on PCB 38 within housing 16 so as to be disposed beneath magnets 34, 36, with the frame 28 separating the sensors 42, 44 from the magnets 34, 36 and magnet holder 30. Other electromagnetic sensors may be implemented in lieu of Hall Effect sensors, such as any sensor that can detect electromagnetic field strength. In other aspects, the sensors 42, 44 may be electromagnetic field sensors that act as transducers generating a signal proportional to one or more aspects of the electromagnetic fields generated by magnets. According to other aspects of the present teachings, housing 16 may be formed of a single piece, or more than two pieces. In addition, the PCB assembly 38 may be mounted to the housing 16 in different ways and in different orientations. In one non-limiting example, PCB assembly 38 can be mounted underneath the housing 16.

The PCB assembly 38 also includes light emitting diodes (LEDs) 46 affixed thereto to provide illumination of the rocker button 14 (i.e., graphic icons on the rocker buttons), so as enable identifying of the switch function and provide a visual indication of the switch state to a user. The LEDs 46 may emit light through rocker button 14 by passing the light through light pipes (not shown) constructed from a transparent material that directs the emitted light toward button 14. Light pipes can be molded directly into frame 28 or can be a separate discrete component. The brightness of the LEDs 46 can be controlled, for example, via LIN or CAN messages received by the switches 12.

According to one embodiment, the circuit board 38 may still further include control circuitry (e.g., controller or microprocessor) thereon, generally indicated at 50, that is in operable communication with the sensors 42, 44. The control circuitry 50 is operative to read the outputs of the sensors 42, 44 of each switch 12 and, in response, generate output signals that control operation of devices controlled by the switches. The control circuitry 50 may function as a multiplex communication device (using a CAN or LIN protocol, for example) to interface with other devices or a controller (not shown), or it can output signals directly to an external controller (not shown).

Referring still to FIG. 3, the switch 12 further includes a vane interrupter 52 therein that is attached to the housing 16 so as to be in a fixed position relative thereto. The vane interrupter 52 is formed from sheet metal, such as from iron or another ferrous material, or may be formed of any magnetic material, including but not limited to magnetic stainless steel. The vane interrupter 52 functions to selectively attenuate the magnetic field generated by each of magnets 34, 36 based on a position of the magnets relative to the vane interrupter 52 and also provides shielding to the magnetic sensors 42, 44 from external magnetic fields. Accordingly, the vane interrupter 52 functions to allows the switch sensors 42, 44 to deactivate when the switch is in the center/neutral position (i.e., when the magnets are centered within the vane interrupter 52) by deflecting the field of the permanent magnets 34, 36 away from the respective sensors 42, 44, with the vane interrupter 52 also providing for better discernment of the distinct switching positions for the switch 12.

Figure 4:
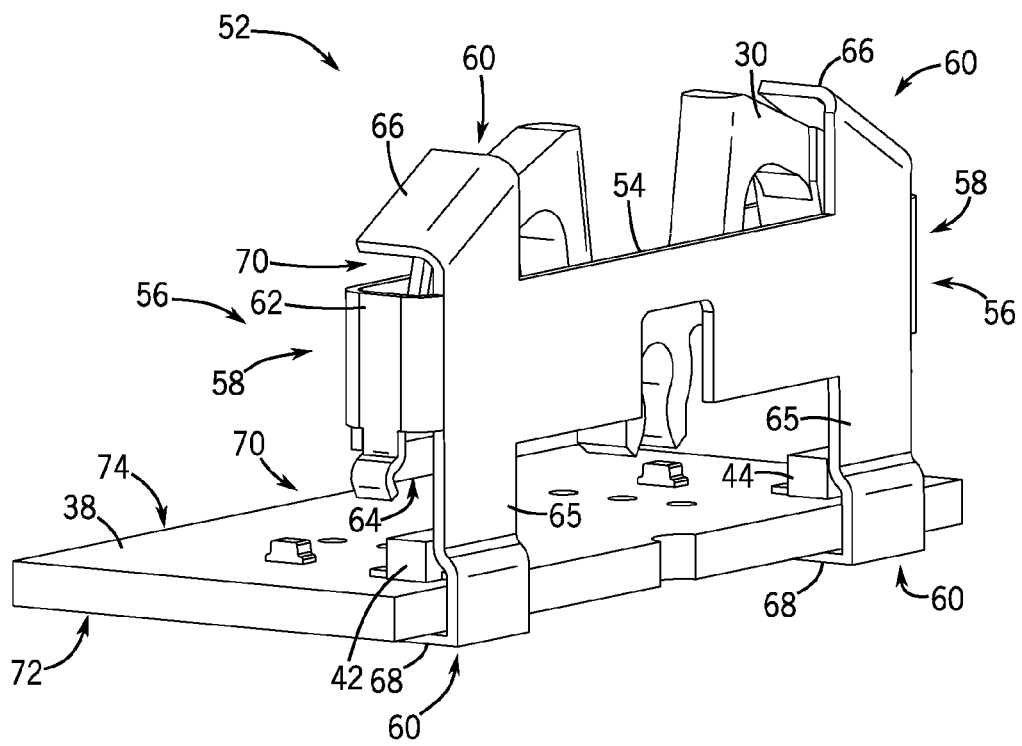
FIG. 4 is a perspective view of a shielded vane interrupter included in a control switch of the switch module of FIG. 1.

As can be seen in FIG. 3 and in greater detail in FIG. 4, in an exemplary embodiment, the vane interrupter 52 is formed as a single, integral component that includes a cross-member 54 with a C-shaped frame 56 positioned on each end thereof that is oriented perpendicular to the cross-member. The C-shaped frame 56 includes a passage structure 58 and a flange structure 60 that collectively provide for the attenuation of the magnetic field generated by each of magnets 34, 36 and the magnetic shielding to the magnetic sensors 42, 44 from external magnetic fields. While the vane interrupter 52 is described above and shown in FIGS. 3 and 4 is a single, integral component, it is recognized that the vane interrupter 52 could be formed/provided as a multi-piece component. More specifically, it is recognized that the C-shaped frame 56 could be formed as a multi-piece component, with the flange structure 60 provided as a separate piece or pieces that are affixed to the C-shaped frame 56 of vane interrupter 52 in a securable fashion.

The passage structure 58 is formed from a plurality of walls 62—e.g. a first wall, second wall, third wall and fourth wall—that collectively define a passage 64 therein, with the passage structure 58 being formed on a lengthwise member 65 of the C-shaped frame 56 at a central location thereon such that openings are provided on opposing ends thereof. While the illustrated passage structure 58 is shown as forming a passage having a rectangular cross-sectional shape, other passage shapes may be implemented, such as circular cross sections, triangular cross-sections, and several other possible cross-sectional shapes. The passage 64 defined by the passage structure 58 is sized so as to accommodate positioning of a member of the magnet holder (and a magnet 34, 36) therein and allow for translation/movement of the magnet holder 30 therethrough, such that positioning of the respective magnet 34, 36 relative to the passage structure 58 can be varied responsive to an actuation of the operating member 14 of switch 12. Accordingly, when a magnet 34, 36 is positioned within passage 64, the passage structure 58 almost completely surrounds the magnet, although it is recognize that the passage structure 58 of vane interrupter 52 need not completely surround the magnet to have the desired effect and that the passage structure 58 could instead only partially surround the magnet. When positioned within the passage 64, the magnetic field of the magnet 34, 36 is attenuated by the passage structure 58 of vane interrupter 52, such that the magnetic field detected by a respective sensor 42, 44 is caused to drop much more rapidly than without the vane interrupter.

The flange structure 60 of the C-shaped frame 56 is composed of a first flange 66 and a second flange 68 located at opposing ends of the lengthwise member, with the first and second flanges 66, 68 being formed on lengthwise member 65 (or attached thereto) so as to generally be perpendicular to the lengthwise member 65. It is recognized, however, that the first flange 66 may, for example, be formed/attached at a slight angle off of perpendicular to accommodate movement of the magnet holder 30 relative thereto (i.e., matching a profile/slope of the magnet holder). The first and second flanges 66, 68 are formed/attached on the lengthwise member 65 so as to be spaced apart from the passage structure 58 by a gap 70. The gap 70 between the first flange 66 and the passage structure 58 allows for positioning of the magnet holder 30 therebetween and provides for adequate movement of the magnet holder 30, while the gap 70 between the second flange 68 and the passage structure 58 allows for positioning of a magnetic sensor 42, 44 therebetween. Accordingly, the first flange 66 is positioned adjacent (i.e., above) a portion of the magnet holder 30 holding the magnet 34, 36 and the second flange 68 is positioned adjacent a surface 72 of the circuit board 38 opposite a surface 74 on which the magnetic sensors 42, 44 are positioned (i.e., the second flange 68 is positioned on a bottom surface of circuit board 38), such that the circuit board 38 is positioned between the magnet holder 30 and the second flange 68.

Based on the positioning and shaping of the passage structure 58 and first and second flanges 66, 68 of flange structure 60, the C-shaped frames 56 of the vane interrupter thus provide an "open" magnetic shielding structure for their respective magnetic sensor 42, 44 that form a continuous path to deflect the external magnetic fields around the magnetic sensors 42, 44. That is, while gaps 70 are formed between the first and second flanges 66, 68 and passage structure 58 such that the C-shaped frame 56 is an "open" structure, the positioning of the flanges 66, 68 below the magnetic sensors 42, 44 and above the passage structure 58 provide a continuous shielding path that acts to deflect an external magnetic field around the magnetic sensors 42, 44.

Figure 5:
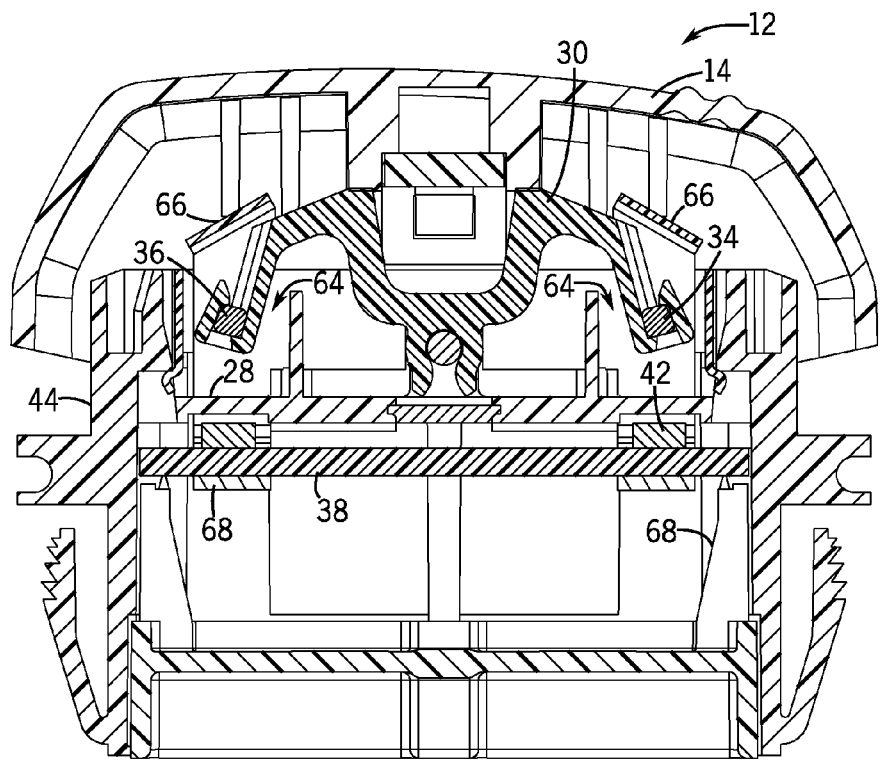
FIGS. 5-7 are sectional views of a control switch in the switch module of FIG. 1 in a neutral position, a first down position, and a second down position.

Referring now to FIG. 5, a switch 12 of switch module 10 is shown in its center, or neutral position. Magnetic sensors 42, 44 are mounted on PCB assembly 38, which in turn is mounted to housing 16. Magnetic sensors 42, 44 are mounted underneath frame 28, which separates sensors 42, 44 from permanent magnets 34, 36 in holder 30. Magnets 34, 36 are disposed inside passages 64 of the ferrous vane interrupter 52 when the switch 12 is in its center/neutral position. When magnets 34, 36 are disposed within passages 64, vane interrupter 52 attenuates the magnetic field of permanent magnets 34, 36 at Hall-effect sensors 42, 44 to a value lower than would otherwise be felt without the presence of vane interrupter 52. In the illustrated position, sensors 42, 44 and the connected electronics on PCB assembly 38 detect that the switch 12 is not in an activated position.

Figure 6:
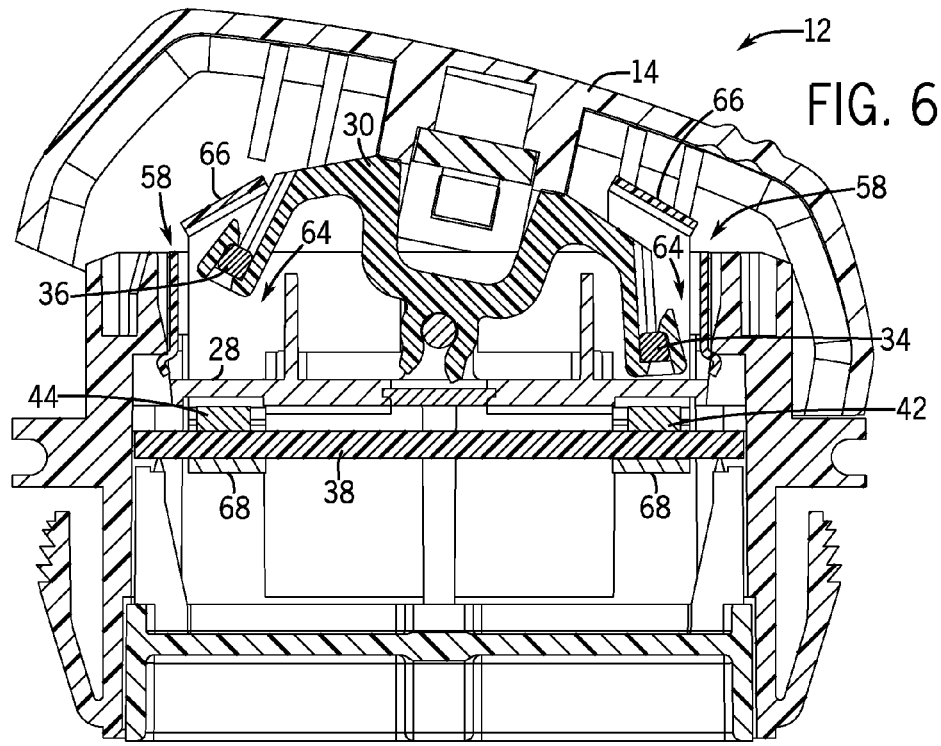

Referring now to FIG. 6, as rocker button 14 is rotated clockwise from the center position, the button 14 pushes magnet holder 30 causing it to rotate. Magnet 34 has moved closer to Hall-effect sensor 42 and closer to an opening of passage structure 58. As magnets 34, 36 move closer to openings of passage structure 58, the attenuating effect of vane interrupter 52 diminishes. As a result of the change in position, the intensity of the magnetic field at sensor 42 rises more rapidly than would otherwise occur without vane interrupter 52, such that sensor 42 is able to detect an activation of switch 12 before switch 12 is fully rotated in the clockwise direction. Upon a full actuation of switch 12, the switch 12 is at its terminal position at the end of its travel in the clockwise direction. In this position, vane interrupter 52 has little effect on the magnetic field surrounding magnet 34, and the magnetic field at sensor 42 is at its highest intensity. In the illustrated position, the magnetic field at sensor 44 is at its lowest intensity as magnet 36 is at its furthest position distal to sensor 44.

Figure 7:
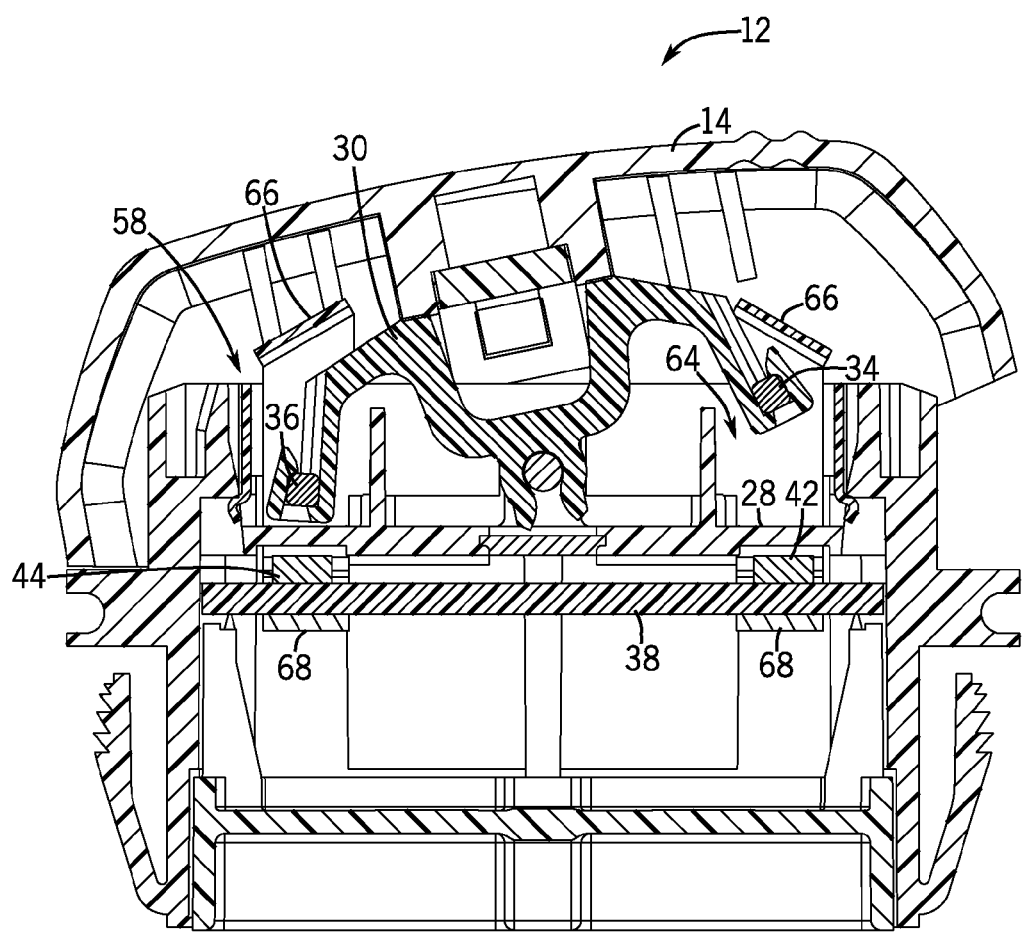

As shown in FIG. 7, switch 12 can also be rotated in the opposite direction—i.e., in the counterclockwise direction. When the rocker button 14 is actuated/depressed to cause the switch 12 to move in the counterclockwise direction from its center/neutral position, the magnet 36 is caused to be moved sufficiently close to sensor 44 to detect actuation. Like the clockwise rotation of switch 12, the counterclockwise rotation can result in sensor 44 detecting the magnetic field of magnet 36 before magnet 36 reaches a terminal position closest to sensor 44. As with the end of travel in the clockwise position, when the switch 12 reaches the end of travel in the counterclockwise direction, magnet 34 is at its furthest position from sensor 42 when magnet 36 is at its terminal position closest to sensor 44. According to an aspect of the present teachings, no contact between Hall-effect sensors 42, 44 and magnets 34, 36 is necessary for switch 12 to function. Further, none of magnets 34, 36 or holder 30 must penetrate the switch housing in order to effectuate switching.

Figure 8:
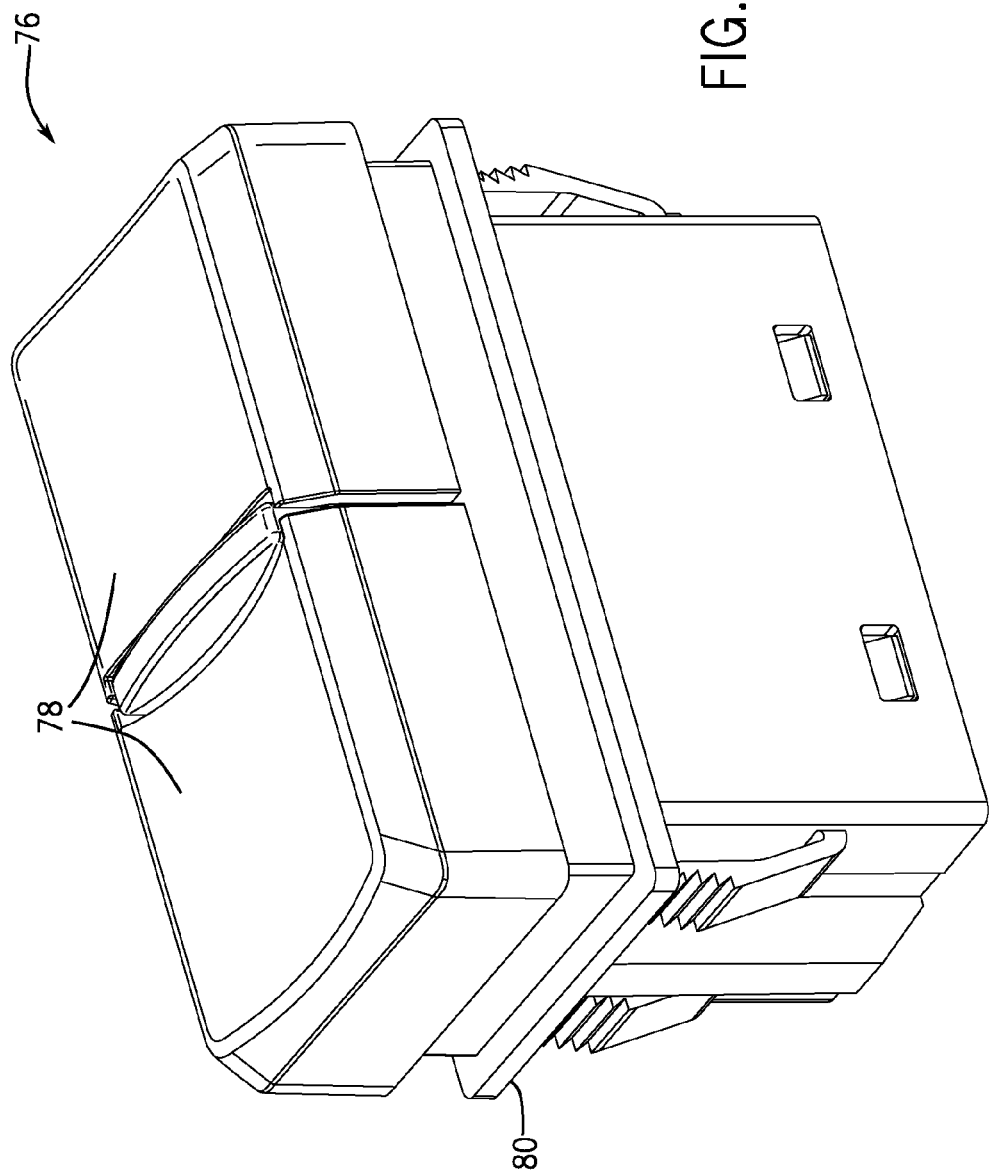
FIG. 8 is a perspective view of a pushbutton switch module, according to an embodiment of the invention.

Referring now to FIGS. 8-10, a dual pushbutton switch 76 is illustrated according to another embodiment of the invention. The dual pushbutton switch 76 includes a pair of pushbuttons 78 that are actuated/pushed by an operator to control operation of various functions, such as functions in a vehicle. The dual pushbutton switch 76 also includes a switch housing 80 that is configured to receive the pair of pushbuttons 78 therein. As can be seen in FIGS. 9 and 10, the underside of each pushbutton 78 includes protrusions or flanges 82 that interact with a magnet holder 84 of the switch 76 in order to cause movement of the magnet holder 84 when the button 78 is depressed, as well as a magnet 86 secured on the magnet holder 84. As shown in FIG. 9, the switch 76 also includes a printed circuit board ("PCB") assembly 38 having an electromagnetic sensor 42 thereon that, according to one embodiment, is a Hall Effect sensor configured to detect a magnetic field generated by magnet 86. Sensor 42 is mounted on PCB 38 within housing 80 so as to be disposed above magnet 86.

Figure 11:
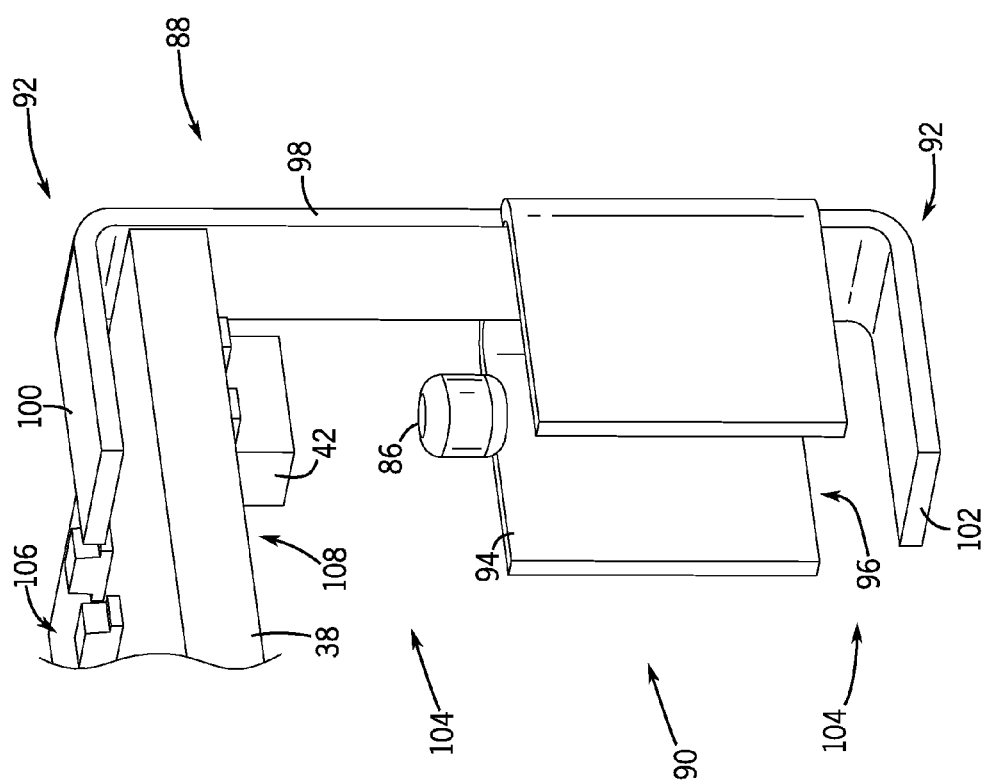
FIG. 11 is a perspective view of a shielded vane interrupter included in the pushbutton switch module of FIG. 8.

Referring still to FIGS. 9 and 10 and additionally to FIG. 11, the switch 12 further includes a vane interrupter 88 therein that is attached to the housing 80 so as to be in a fixed position relative thereto. Similar to the vane interrupter 52 of FIG. 4, vane interrupter 88 is formed from a ferrous material or any magnetic material, including but not limited to magnetic stainless steel. The vane interrupter 88 functions to selectively attenuate the magnetic field generated by magnet 86 based on a position of the magnet relative to the vane interrupter and also provides shielding to the magnetic sensor 42 from external magnetic fields.

As can best be seen in FIG. 11, in an exemplary embodiment, the vane interrupter 88 is formed as a C-shaped frame that includes a passage structure 90 and a flange structure 92 that collectively provide for the attenuation of the magnetic field generated by magnet 86 and provide magnetic shielding to the magnetic sensor 42 from external magnetic fields. The passage structure 90 is formed from a plurality of walls 94 that collectively define a passage 96 therein, with the passage structure 90 being formed on a lengthwise member 98 of the vane interrupter 88. The passage 96 defined by the passage structure 90 is sized so as to accommodate positioning of a member of the magnet holder 84 (FIGS. 9 and 10) and magnet 86 therein and allow for translation/movement of the magnet holder 84 therethrough, such that positioning of the magnet 86 relative to the passage structure 90 can be varied responsive to an actuation of the pushbutton 78 of switch 76. Accordingly, when magnet 86 is positioned within passage 96, the passage structure 90 almost completely surrounds the magnet. When positioned within the passage 96, the magnetic field of the magnet 86 is attenuated by the passage structure 90 of vane interrupter 88, such that the magnetic field detected by the sensor 42 is caused to drop much more rapidly than without the vane interrupter.

The flange structure 92 of the vane interrupter 88 is composed of a first flange 100 and a second flange 102 located at opposing ends of the lengthwise member 98, with the first and second flanges 100, 102 being formed so as to generally be perpendicular to the lengthwise member 98. The first and second flanges 100, 102 are formed on the lengthwise member 98 so as to be spaced apart from the passage structure 90 by a gap 104. The gap 104 between the first flange 100 and the passage structure 90 allows for positioning of the magnetic sensor 42 therebetween, with the first flange 100 being positioned adjacent a surface 106 of the circuit board 38 opposite a surface 108 on which the magnetic sensor 42 is positioned (i.e., the first flange 100 is positioned on a top surface 106 of circuit board 38), such that the circuit board 38 is positioned between the magnet 86 and the first flange 100.

Based on the positioning and shaping of the passage structure 90 and first and second flanges 100, 102 of flange structure 92, the C-shaped vane interrupter 88 thus provides an "open" magnetic shielding structure for the Hall effect sensor 42 that forms a continuous shielding path to deflect the external magnetic fields around the Hall effect sensor 42. That is, while gaps 104 are formed between the first and second flanges 100, 102 and passage structure 90 such that the C-shaped vane interrupter 88 is an "open" structure, the positioning of the flanges 100, 102 above and below the magnetic sensor 42 provide a continuous shielding path that acts to deflect an external magnetic field around the magnetic sensor.

Beneficially, embodiments of the invention thus provide a contactless control switch constructed such that shielding from external magnetic fields is provided to the magnetic sensor(s) therein via a shielding vane interrupter. The shielding provided to the magnetic sensor(s) is provided via an existing component—a vane interrupter—to which an additional flange structure is added to provide improved magnetic shielding. While the shielding vane interrupter is not formed as an enclosure that surrounds the magnetic sensor(s) (i.e., it is an "open" shielding structure), the vane interrupter provides a continuous shielding path to deflect an external magnetic field around the magnetic sensor(s).

Therefore, according to one embodiment of the present invention, a switch includes a switch housing, a button moveably mounted to the housing, a circuit board mounted to the housing and including at least one magnet sensor and a magnet holder, including at least one magnet, movably mounted to the housing so as to move responsive to an actuation of the button by a user, such that the at least one magnet is selectively movable to positions distal to and proximate to the magnet sensor. The switch also includes a vane interrupter having a passage structure positioned proximate to each magnet sensor of the at least one magnet sensor such that a respective magnet of the at least one magnet is movable at least partially within a passage defined by the passage structure and a flange structure positioned adjacent each passage structure, the flange structure comprising a first flange and a second flange positioned on opposing ends of the passage structure, with the first flange positioned adjacent a portion of the magnet holder holding the magnet and with the second flange positioned adjacent a surface of the circuit board opposite a surface on which the at least one magnet sensor is positioned, such that the circuit board is positioned between the magnet holder and the second flange.

According to another embodiment of the present invention, a switch includes a switch housing, an operating member mounted to the switch housing and movable between a plurality of positions responsive to physical actuation thereof by an operator, one or more magnet sensors secured relative to the housing, and a magnet holder mounted to the housing to position one or more magnets included thereon adjacent the one or more magnet sensors, the magnet holder moving responsive to an actuation of the operating member by a user so as to provide for positioning of the one or more magnets. The switch also includes a vane interrupter configured to provide selective magnetic shielding about the one or more magnets and to the one or more magnet sensors, the vane interrupter comprising a C-shaped frame that includes a lengthwise member oriented generally parallel to a direction of movement of the one or more magnets to form a passage sized to accommodate positioning of a respective magnet of the one or magnets therein and a pair of flanges formed on or attached to opposing ends of the lengthwise member and oriented generally perpendicular thereto. A respective magnet sensor of the one or more magnet sensors and a respective magnet of the one or more magnets are positioned between the pair of flanges of the C-shaped frame, such that the pair of flanges provide shielding to the respective magnet sensor from external magnetic fields.

According to yet another embodiment of the present invention, a rocker switch includes a switch housing, a rocker button mounted to the switch housing and actuatable between a neutral position, a first position, and a second position, a magnet holder including therein a first magnet and a second magnet and being mounted to the housing so as to be rotatable relative thereto, a first Hall effect sensor and a second Hall effect sensor positioned adjacent the first magnet and the second magnet, respectively, and a vane interrupter comprising a C-shaped frame on each of opposing sides thereof such that a first C-shaped frame is positioned adjacent the first magnet sensor and the first magnet and a second C-shaped frame is positioned adjacent the second magnet sensor and the second magnet. Each of the C-shaped frames further includes a passage structure positioned proximate to a respective magnet sensor such that a respective magnet is movable at least partially within a passage defined by the passage structure and a flange structure positioned adjacent the passage structure and including a first flange and a second flange positioned on opposing ends of the passage structure, with the flange structure positioned to shield its respective Hall effect sensor from external magnetic fields.

The present invention has been described in terms of the preferred embodiment, and it is recognized that equivalents, alternatives, and modifications, aside from those expressly stated, are possible and within the scope of the appending claims.

What is claimed is:

1. A switch comprising:
   a switch housing;
   a button moveably mounted to the housing;
   a circuit board mounted to the housing and including at least one magnet sensor;
   a magnet holder, including at least one magnet, movably mounted to the housing so as to move responsive to an actuation of the button by a user, such that the at least one magnet is selectively movable to positions distal to and proximate to the magnet sensor; and
   a vane interrupter comprising:
      a passage structure positioned proximate to each magnet sensor of the at least one magnet sensor such that a respective magnet of the at least one magnet is movable at least partially within a passage defined by the passage structure; and
      a flange structure positioned adjacent each passage structure, the flange structure comprising a first flange and a second flange positioned on opposing ends of the passage structure, with the first flange positioned adjacent a portion of the magnet holder holding the magnet and with the second flange positioned adjacent a surface of the circuit board opposite a surface on which the at least one magnet sensor is positioned, such that the circuit board is positioned between the magnet holder and the second flange.

2. The switch of claim 1 wherein the passage structure of the vane interrupter includes a plurality of walls that define the passage.

3. The switch of claim 1 wherein the first flange and the second flange are oriented generally perpendicular to a direction of the passage defined by the passage structure.

4. The switch of claim 1 wherein the vane interrupter includes a ferromagnetic material.

5. The switch of claim 1 wherein the passage structure and the flange structure are integrally formed as a single vane interrupter, with the first flange and the second flange being positioned on opposing ends of the passage structure such that a gap is present between the passage structure and the flange structure; and wherein the passage structure and the flange structure of the vane interrupter form a continuous path to deflect an external magnetic field around the magnetic sensor.

6. The switch of claim 1 wherein:

the switch comprises a rocker switch actuatable between a neutral switch position, a first switch position, and a second switch position;

the at least one magnet sensor comprises a first magnet sensor and a second magnet sensor and the magnet holder includes a first magnet and a second magnet; and the vane interrupter comprises a first passage structure positioned adjacent the first magnet sensor and a second passage structure positioned adjacent the second magnet sensor.

7. The switch of claim 6 wherein, when the switch is in the neutral switch position, the first magnet and the second magnet are positioned at a neutral magnet position within the passage of the first passage structure and the passage of the second passage structure, respectively, such that the vane interrupter weakens a signal emitted by the first magnet and the second magnet.

8. The switch of claim 6 wherein, when the switch is in the first switch position, the button interacts with the magnet holder so as to cause the first magnet to be moved to a second magnet position proximate to the first sensor and the second magnet to be moved to a first magnet position distal to the second sensor.

9. The switch of claim 6 wherein, when the switch is in the second switch position, the button interacts with the magnet holder so as to cause the second magnet to be moved to a second magnet position proximate to the second sensor and the first magnet to be moved to a first magnet position distal to the first sensor.

10. The switch of claim 6, wherein the vane interrupter is fixed relative to the housing, and the magnetic holder is rotatably mounted to the housing.

11. The switch of claim 1 wherein the switch comprises a push-button switch actuatable between a first switch position and a second switch position, with the at least one magnet sensor comprising a single magnet sensor and the magnet holder including a single magnet.

12. The switch of claim 11 wherein, when the switch is in the first switch position, the magnet is positioned proximate to the magnet sensor and outside of the passage; and wherein, when the switch is in the second switch position, the magnet is positioned distal to the magnet sensor and within the passage, such that the vane interrupter weakens a signal emitted by the magnet.

13. A switch comprising:

a switch housing;

an operating member mounted to the switch housing and movable between a plurality of positions responsive to physical actuation thereof by an operator;

one or more magnet sensors secured relative to the housing;

a magnet holder mounted to the housing to position one or more magnets included thereon adjacent the one or more magnet sensors, the magnet holder moving responsive to an actuation of the operating member by a user so as to provide for positioning of the one or more magnets; and a vane interrupter configured to provide selective magnetic shielding about the one or more magnets and to the one or more magnet sensors, the vane interrupter comprising a C-shaped frame including:

a lengthwise member oriented generally parallel to a direction of movement of the one or more magnets, with a portion of the lengthwise member forming a passage sized to accommodate positioning of a respective magnet of the one or magnets therein; and a pair of flanges formed on or attached to opposing ends of the lengthwise member and oriented generally perpendicular thereto;

wherein a respective magnet sensor of the one or more magnet sensors and a respective magnet of the one or more magnets are positioned between the pair of flanges of the C-shaped frame, such that the pair of flanges provide shielding to the respective magnet sensor from external magnetic fields.

14. The switch of claim 13 wherein the lengthwise member comprises a passage structure formed thereon that includes a plurality of walls defining the passage; and wherein a respective magnet of the one or more magnets is movable at least partially within the passage such that a magnetic field of the respective magnet is attenuated when positioned within the passage.

15. The switch of claim 13 wherein the C-shaped frame forms a continuous shielding path to deflect the external magnetic field around the respective magnet sensor.

16. The switch of claim 13 wherein the operating member comprises a rocker button actuatable between a neutral position, a first position, and a second position, the one or more magnet sensors comprises a first magnet sensor and a second magnet sensor, and the one or more magnets comprises a first magnet and a second magnet; and wherein the vane interrupter comprises a C-shaped frame on each of opposing sides thereof, such that a first C-shaped frame is positioned adjacent the first magnet sensor and the first magnet and a second C-shaped frame is positioned adjacent the second magnet sensor and the second magnet.

17. The switch of claim 14 wherein the operating member comprises a push-button actuatable between a first position and a second position, the one or more magnet sensors comprises a single magnet sensor, and the one or more magnets comprises a single magnet; and wherein the vane interrupter comprises a single C-shaped frame positioned adjacent the magnet sensor and the magnet.

18. A rocker switch comprising:

a switch housing;

a rocker button mounted to the switch housing and actuatable between a neutral position, a first position, and a second position;

a magnet holder mounted to the housing so as to be rotatable relative thereto, with the magnet holder including therein a first magnet and a second magnet; and a first Hall effect sensor and a second Hall effect sensor positioned adjacent the first magnet and the second magnet, respectively; and a vane interrupter comprising a C-shaped frame on each of opposing sides thereof such that a first C-shaped frame is positioned adjacent the first magnet sensor and the first magnet and a second C-shaped frame is positioned adjacent the second magnet sensor and the second magnet, wherein each of the C-shaped frames comprises:

a passage structure positioned proximate to a respective magnet sensor such that a respective magnet is movable at least partially within a passage defined by the passage structure; and a flange structure positioned adjacent the passage structure and including a first flange and a second flange positioned on opposing ends of the passage structure, with the flange structure positioned to shield its respective Hall effect sensor from external magnetic fields.

19. The rocker switch of claim 18 wherein each of the C-shaped frames of the vane interrupter comprises an open magnetic shielding structure for its respective Hall effect sensor that forms a continuous path to deflect the external magnetic fields around the Hall effect sensor, with the first and second flanges being positioned on opposing ends of the passage structure such that a gap is present between the passage structure and the first and second flanges.

20. The rocker switch of claim 18 wherein:

when the rocker button is in the neutral position, the first and second magnets are positioned within the passage of their respective passage structure, such that a magnetic field generated by each of the first and second magnets is attenuated;

when the rocker button is in the first position, the first magnet in the magnet holder is positioned proximate the first Hall effect sensor and the second magnet in the magnet holder is positioned distal from the second Hall effect sensor; and when the rocker button is in the second position, the first magnet in the magnet holder is positioned distal from the first Hall effect sensor and the second magnet in the magnet holder is positioned proximate the second Hall effect sensor.

* * * * *